US010157779B2

(12) United States Patent
Lin

(10) Patent No.: US 10,157,779 B2
(45) Date of Patent: Dec. 18, 2018

(54) MULTI-BARRIER DEPOSITION FOR AIR GAP FORMATION

(71) Applicant: Taiwan Semiconductor Manufacturing Company, Ltd., Hsinchu (TW)

(72) Inventor: Hsiang-Wei Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 15/665,908

(22) Filed: Aug. 1, 2017

(65) Prior Publication Data

US 2017/0358481 A1    Dec. 14, 2017

Related U.S. Application Data

(63) Continuation of application No. 14/942,615, filed on Nov. 16, 2015, now Pat. No. 9,728,447.

(51) Int. Cl.
*H01L 21/768* (2006.01)
*H01L 21/764* (2006.01)
(Continued)

(52) U.S. Cl.
CPC ........ *H01L 21/7682* (2013.01); *H01L 21/764* (2013.01); *H01L 21/76802* (2013.01); *H01L 21/76832* (2013.01); *H01L 21/76834* (2013.01); *H01L 23/528* (2013.01); *H01L 23/5222* (2013.01); *H01L 23/5226* (2013.01);
(Continued)

(58) Field of Classification Search
CPC ............... H01L 29/0649; H01L 21/764; H01L 21/7682; H01L 21/76832; H01L 21/76834; H01L 21/76802; H01L 23/5222; H01L 23/53295; H01L 23/825; H01L 23/5226; H01L 2221/1042; H01L 21/02274
See application file for complete search history.

(56) References Cited

U.S. PATENT DOCUMENTS 5,759,913 A    6/1998  Fulford et al.
6,399,476 B2 *  6/2002  Kim .................... H01L 21/7682
                                          257/E21.581
(Continued)

OTHER PUBLICATIONS

Noguchi, Junji et al., "Multilevel Interconnect With Air-Gap Structure for Next-Generation Interconnections," IEEE Transactions on Electron Devices, vol. 56, No. 11, Nov. 2009, pp. 2675-2682.
(Continued)

*Primary Examiner* — Joseph C. Nicely
(74) *Attorney, Agent, or Firm* — Slater Matsil, LLP

(57) ABSTRACT

A method includes forming a first conductive line and a second conductive line in a dielectric layer, etching a portion of the dielectric layer to form a trench between the first conductive line and the second conductive line, and forming a first etch stop layer. The first etch stop layer extends into the trench. A second etch stop layer is formed over the first etch stop layer. The second etch stop layer extends into the trench, and the second etch stop layer is more conformal than the first etch stop layer. A dielectric material is filled into the trench and over the second etch stop layer. An air gap is formed in the dielectric material.

20 Claims, 11 Drawing Sheets

(51) Int. Cl.
*H01L 23/522* (2006.01)
*H01L 23/528* (2006.01)
*H01L 29/06* (2006.01)
*H01L 23/532* (2006.01)

(52) U.S. Cl.
CPC .... *H01L 23/53295* (2013.01); *H01L 29/0649* (2013.01); *H01L 2221/1042* (2013.01)

(56) References Cited

U.S. PATENT DOCUMENTS

| | | | | |
|---|---|---|---|---|
| 8,120,179 B2* | 2/2012 | Chanda | ............... | H01L 21/7682 257/751 |
| 9,754,821 B2* | 9/2017 | King | ................. | H01L 21/02178 |
| 9,972,528 B2* | 5/2018 | Nguyen | ............ | H01L 21/76802 |
| 2007/0246831 A1* | 10/2007 | Gabric | ................ | H01L 21/7682 257/758 |
| 2008/0057666 A1* | 3/2008 | Kim | ................... | H01L 21/7682 438/422 |
| 2008/0099876 A1* | 5/2008 | Seto | ................. | H01L 21/76801 257/522 |
| 2008/0265377 A1 | 10/2008 | Clevenger et al. | | |
| 2009/0023279 A1* | 1/2009 | Kim | ...................... | H01L 21/764 438/594 |
| 2009/0093112 A1 | 4/2009 | Al-Bayati et al. | | |
| 2010/0015813 A1* | 1/2010 | McGinnis | ......... | H01L 21/02164 438/771 |
| 2010/0093168 A1 | 4/2010 | Naik | | |
| 2010/0130001 A1* | 5/2010 | Noguchi | ........... | H01L 21/76811 438/627 |
| 2010/0133648 A1 | 6/2010 | Seidel et al. | | |
| 2011/0183490 A1* | 7/2011 | Gogoi | ................... | H01L 21/764 438/424 |
| 2011/0266676 A1 | 11/2011 | Isobayashi | | |
| 2015/0303140 A1 | 10/2015 | Lin | | |
| 2016/0043088 A1* | 2/2016 | Cartier | ................ | H01L 27/1087 257/303 |
| 2016/0240428 A1* | 8/2016 | Tung | ................. | H01L 21/7682 |
| 2016/0315004 A1 | 10/2016 | Lin | | |
| 2017/0062265 A1* | 3/2017 | Lin | ....................... | H01L 21/764 |

OTHER PUBLICATIONS

Noguchi, Junji et al., "Process and Reliability of Air-Gap Cu Interconnect Using 90-nm Node Technology," IEEE Transactions on Electron Devices, vol. 52, No. 3, Mar. 2005, pp. 352-359.

* cited by examiner

MULTI-BARRIER DEPOSITION FOR AIR GAP FORMATION

PRIORITY CLAIM AND CROSS-REFERENCE

This application is a continuation of U.S. patent application Ser. No. 14/942,615, entitled "Multi-Barrier Deposition for Air Gap Formation," filed on Nov. 16, 2015, which application is incorporated herein by reference.

BACKGROUND

Integrated circuit devices such as transistors are formed on semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias in a low-k dielectric layer, the low-k dielectric layer is first etched to form trenches and via openings. The etching of the low-k dielectric layer may involve forming a patterned hard mask over the low-k dielectric material, and using the patterned hard mask as an etching mask to form trenches. Via openings are also formed and substantially aligned to the trenches. The trenches and the via openings are then filled with a metallic material, which may comprise copper. A Chemical Mechanical Polish (CMP) is then performed to remove excess portions of the metallic material over the low-k dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
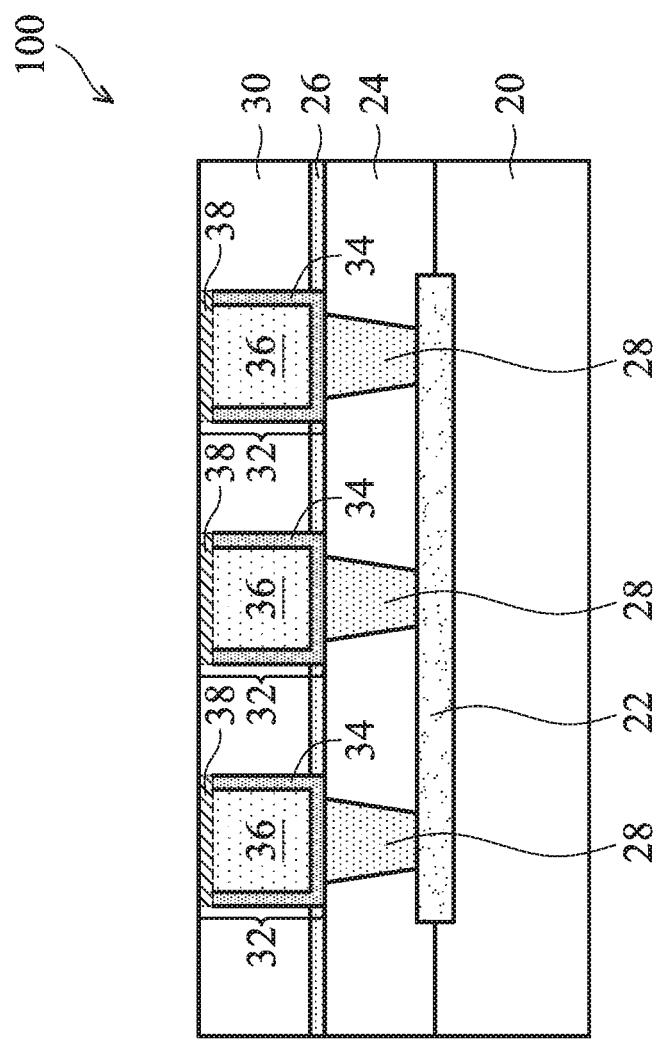
FIGS. 1 through 10 illustrate the cross-sectional views of intermediate stages in the formation of an interconnect structure having air gaps in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure with air gaps and the method of forming the same are provided in accordance with various exemplary embodiments. The intermediate stages of forming the air gaps are illustrated. Some variations of some embodiments are discussed. Throughout the various views and illustrative embodiments, like reference numbers are used to designate like elements.

FIGS. 1 through 10 illustrate the cross-sectional views of intermediate stages in the formation of interconnect structures of integrated circuits in accordance with some embodiments. The steps shown in FIG. 1 through 10 are also shown in the process flow 200 in FIG. 11.

FIG. 1 illustrates wafer 100, which includes semiconductor substrate 20 and the features formed over semiconductor substrate 20. In accordance with some embodiments of the present disclosure, semiconductor substrate 20 comprises crystalline silicon, crystalline germanium, silicon germanium, a III-V compound semiconductor such as GaAsP, AlInAs, AlGaAs, GaInAs, GaInP, GaInAsP, and/or the like. Semiconductor substrate 20 may also be a bulk silicon substrate or a Silicon-On-Insulator (SOI) substrate.

In accordance with some embodiments of the present disclosure, wafer 100 is used to form a device die. In these embodiments, integrated circuit devices 22 are formed on the top surface of semiconductor substrate 20. Exemplary integrated circuit devices 22 may include Complementary Metal-Oxide Semiconductor (CMOS) transistors, resistors, capacitors, diodes, or the like. The details of integrated circuit devices 22 are not illustrated herein. In accordance with alternative embodiments, wafer 100 is used for forming interposers. In these embodiments, no active devices such as transistors and diodes are formed on substrate 20. There may (or may not) be passive devices such as capacitors, resistors, inductors, or the like formed in wafer 100. Substrate 20 may also be a dielectric substrate in the embodiments in which wafer 100 is an interposer wafer. Furthermore, through-vias (not shown) may be formed to penetrate through substrate 20 in order to interconnect the components on the opposite sides of substrate 20.

Inter-Layer Dielectric (ILD) 24 is formed over semiconductor substrate 20 and fills the space between the gate stacks of transistors (not shown) in integrated circuit devices 22. In some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In accordance with alternative embodiments of the present disclosure, ILD 24 is formed using a deposition method such as Plasma Enhanced Chemical Vapor Deposition (PECVD), Low Pressure Chemical Vapor Deposition (LPCVD), or the like.

As also shown in FIG. 1, etch stop layer 26 is formed over ILD 24 and integrated circuit devices 22, if any. Etch stop layer 26 may be formed of silicon carbide, silicon nitride, silicon oxynitride, silicon carbo-nitride, or the like. Etch stop layer 26 is formed of a material that has a high etching selectivity relative to the overlying dielectric layer 30, and hence etch stop layer 26 may be used to stop the etching of dielectric layer 30.

Contact plugs 28 are formed in ILD 24 and are used to electrically connect to integrated circuit devices 22. For example, contact plugs 28 may include gate contact plugs that are connected to the gate electrodes of transistors (not shown) in integrated circuit devices 22 and source/drain contact plugs that are electrically connected to the source/drain regions of the transistors. In accordance with some embodiments of the present disclosure, contact plugs 28 are formed of a material selected from tungsten, aluminum, copper, titanium, tantalum, titanium nitride, tantalum nitride, alloys therefore, and/or multi-layers thereof. The formation of contact plugs 28 may include etching ILD 24 to form contact openings, filling a conductive material(s) into the contact openings until the conductive material fills the entireties of the contact openings, and performing a planarization (such as Chemical Mechanical Polish (CMP)) to level the top surfaces of contact plugs 28 with the top surface of ILD 24.

Further illustrated in FIG. 1 is dielectric layer 30, which is alternatively referred to as Inter-Metal Dielectric (IMD) layer 30 hereinafter. In accordance with some embodiments of the present disclosure, IMD layer 30 is formed of a low-k dielectric material having a dielectric constant (k-value) lower than about 3.0, lower about 2.5, or even lower. IMD layer 30 may be formed of Black Diamond (a registered trademark of Applied Materials), an oxygen-containing a carbon containing low-k dielectric material, Hydrogen SilsesQuioxane (HSQ), MethylSilsesQuioxane (MSQ), or the like.

Conductive lines 32 are formed in IMD 30. In accordance with some embodiments of the present disclosure, conductive lines 32 include diffusion barrier layers 34 and copper-containing material 36 over diffusion barrier layers 34. Diffusion barrier layers 34 may include titanium, titanium nitride, tantalum, tantalum nitride, or the like, and have the function of preventing copper in copper-containing material 36 from diffusing into IMD 30. Conductive lines 32 are referred to as metal lines 32 hereinafter.

In accordance with some embodiments of the present disclosure, metal caps 38 are formed over metal lines 32. Metal caps 38 may also be considered as parts of metal lines 32 throughout the description. In accordance with some embodiments, metal caps 38 include cobalt (Co), CoWP, CoB, tungsten (W), tantalum (Ta), nickel (Ni), molybdenum (Mo), titanium (Ti), iron (Fe), or alloys thereof. Metal caps 38 may be formed selectively using ElectroChemical Plating (ECP) or electroless plating, during which wafer 100 is submerged in a plating solution. In accordance with alternative embodiments, metal caps 38 are blanket formed on metal lines 32 and IMD layer 30, followed by an etching process to remove undesirable portions. FIG. 1 illustrates that metal lines 32 are in a bottom metal layer, which is the metal layer immediately over contact plugs 28. The illustrated metal lines 32 also represent metal lines in any metal layer that is over the bottom metal layer.

Figure 2:
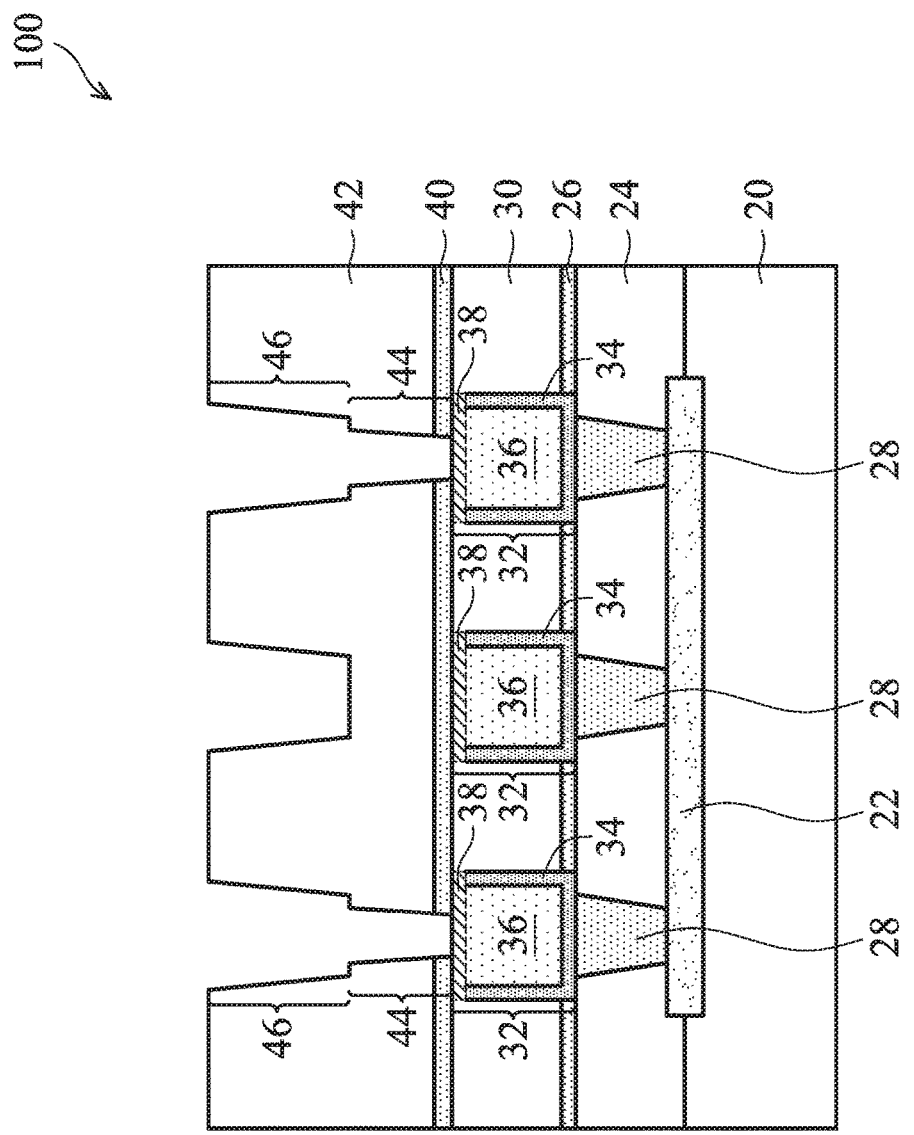

Referring to FIG. 2, etch stop layer 40 and IMD layer 42 are formed. In accordance with some embodiments of the present disclosure, etch stop layer 40 is formed of silicon carbide, silicon nitride, silicon oxynitride, silicon carbo-nitride, or the like. Etch stop layer 40 may be in contact with IMD layer 30. IMD layer 42 may be formed of a material that is selected from the same candidate materials for forming IMD layer 30. For example, IMD layer 42 may comprise silicon, oxygen, carbon, fluorine, and/or the like, and may be formed of an oxygen-containing and/or carbon-containing dielectric material, Black Diamond (a registered trademark of Applied Materials), HSQ, MSQ, or the like. In accordance with some exemplary embodiments, IMD layer 42 is formed of SiCO. IMD layer 42 may also have a low-k value, which may be lower than about 3.0, 2.5, or 2.0. In accordance with some embodiments of the present disclosure, the formation of IMD layer 42 includes depositing a porogen-containing dielectric material, and then performing a curing process to drive out the porogen. The remaining IMD layer 42 becomes porous. The thickness of IMD layer 42 may be in the range between about 500 Å and about 5,000 Å.

FIG. 2 also illustrates the formation of trenches 46 and via openings 44 in IMD layer 42. In accordance with some embodiments of the present disclosure, the formation processes includes using a photo lithography process to etch IMD layer 42 in order to form initial via openings. The initial via openings extend from the top surface of IMD layer 42 to an intermediate level between the top surface and the bottom surface of IMD layer 42. Next, a metal hard mask (not shown) is formed and patterned to define the patterns of trench 46. An anisotropic etching is then performed to etch IMD layer 42 and to form trenches 46. At the same time trenches 46 are formed, the initial via openings extend down to etch stop layer 40, hence forming via openings 44. In accordance with alternative embodiments, via openings 44 and trenches 46 are formed in separate photo lithography processes. For example, in a first photo lithography process, via openings 44 are formed down to etch stop layer 40. In a second lithography process, trenches 46 are formed. Etch stop layer 40 is then etched to expose the underlying metal caps 38.

In accordance with some embodiments of the present disclosure, the etching of IMD layer 42 is performed using a process gas comprising fluorine and carbon, wherein fluorine is used for etching, with carbon having the effect of protecting the sidewalls of the resulting via openings 44 and trenches 46. With an appropriate fluorine to carbon ratio, via openings 44 and trenches 46 may have desirable profiles.

Figure 3:
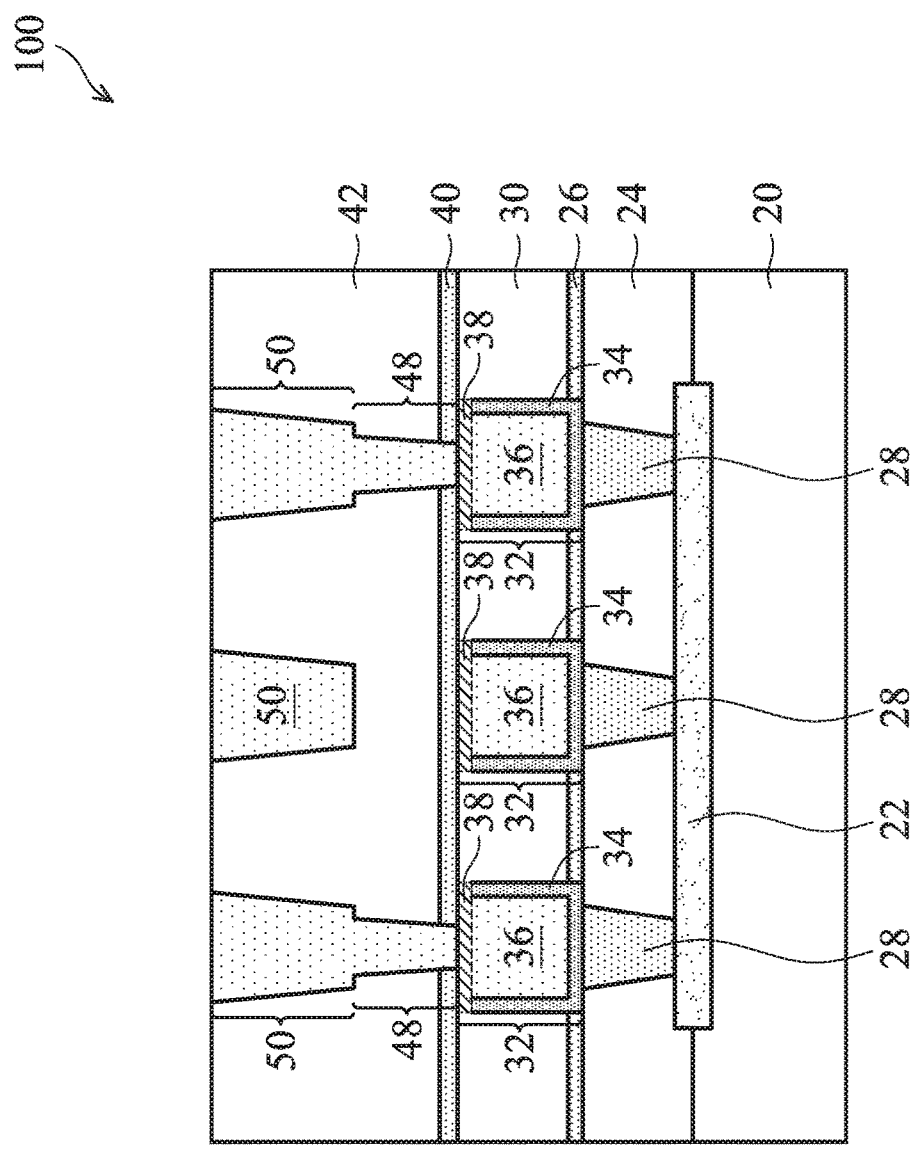

FIG. 3 illustrates the formation of conductive vias 48 in via openings 44 (FIG. 2), and conductive lines 50 in trenches 46. The respective step is shown as step 202 in the process flow shown in FIG. 11. Vias 48 and conductive lines 50 may include liners (not shown), such as diffusion barrier layers, adhesion layers, or the like. The liners may include titanium, titanium nitride, tantalum, tantalum nitride, or other alternatives. The inner material of conductive lines 50 may be a conductive material such as copper, a copper alloy, tungsten, aluminum, or the like. In accordance with some embodiments of the present disclosure, the formation of vias 48 and conductive lines 50 includes performing a blanket deposition to form the liner, depositing a thin seed layer of copper or copper alloy, and filling the rest of via openings 44 and trenches 46 using, for example, electro-plating, electro-less plating, deposition, or the like. A Chemical Mechanical Planarization (CMP) is performed to level the surface of conductive lines 50, and to remove excess portions of conductive materials.

Figure 4:
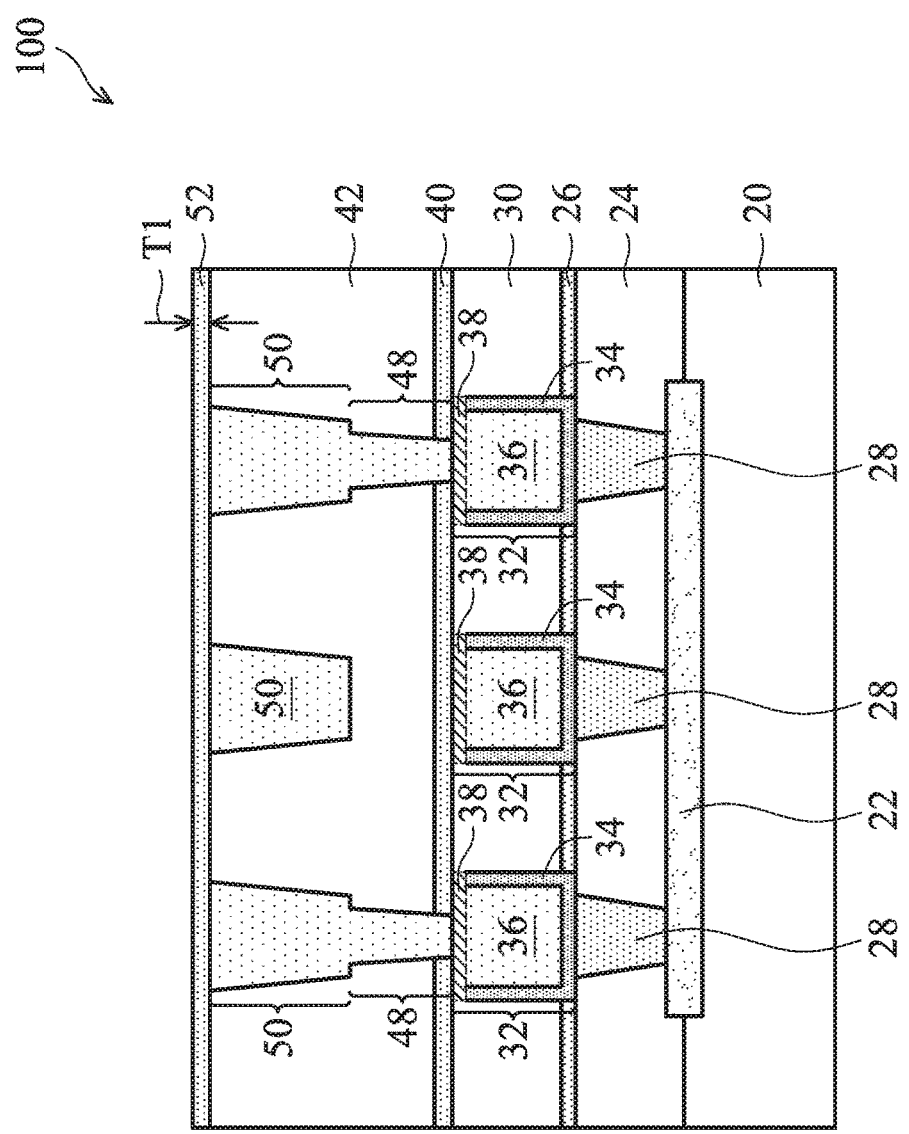

Referring to FIG. 4, etch stop layer 52 is formed. The respective step is shown as step 204 in the process flow shown in FIG. 11. In accordance with some embodiments of the present disclosure, etch stop layer 52 is formed of a dielectric material, which may include a first element(s) such as Si and/or Al, and second elements selected from carbon, nitride, oxygen, hydrogen, boron, or the like. In accordance with some exemplar embodiments, etch stop layer 52 is formed of silicon carbide, silicon nitride, silicon oxynitride, silicon carbo-nitride, or the like. Etch stop layer 52 is in contact with conductive lines 50. Thickness T1 of etch stop layer 52 may be in the range between about 10 Å and about 500 Å.

In accordance with some embodiments of the present disclosure, etch stop layer 52 is a planar layer having a uniform thickness. Etch stop layer 52 may be formed using Plasma Enhanced Chemical Vapor Deposition (PECVD). In the formation of etch stop layer 52, the plasma may be turned on continuously during the entire period etch stop layer 52 is deposited.

Figure 5:
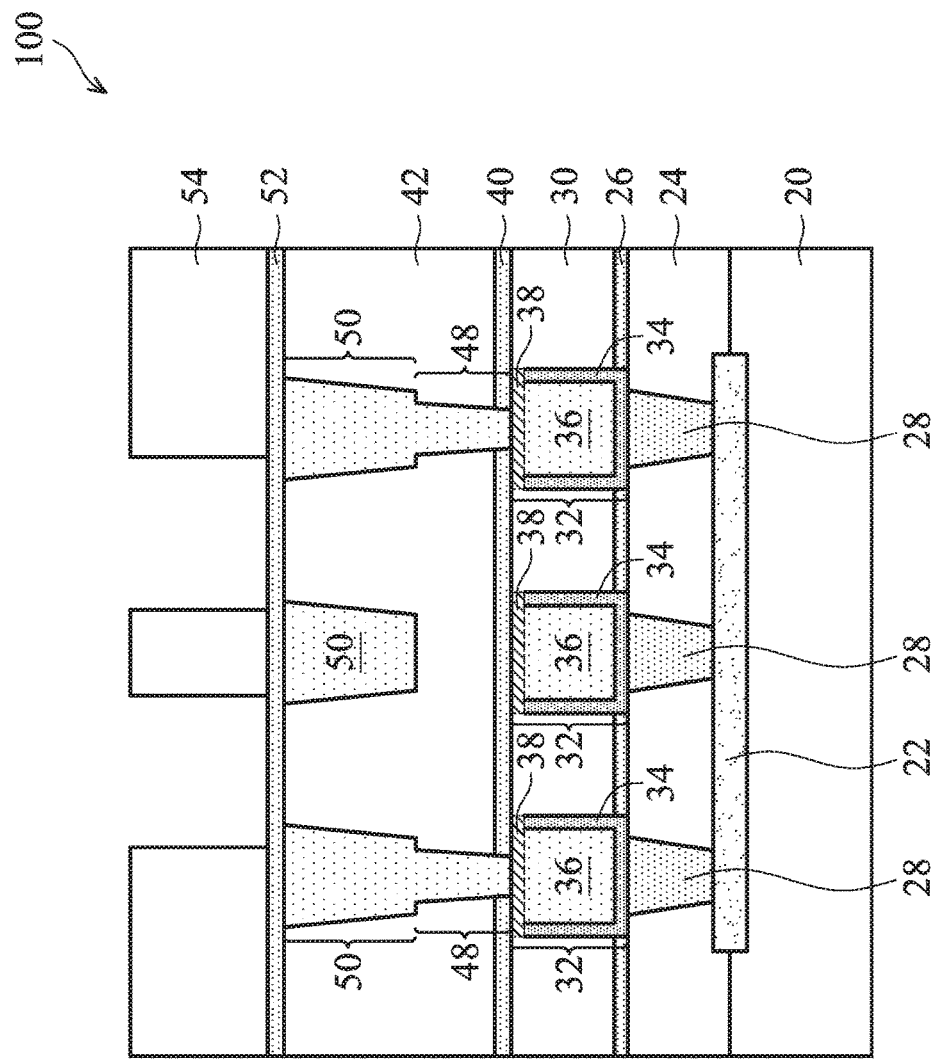
Figure 6:
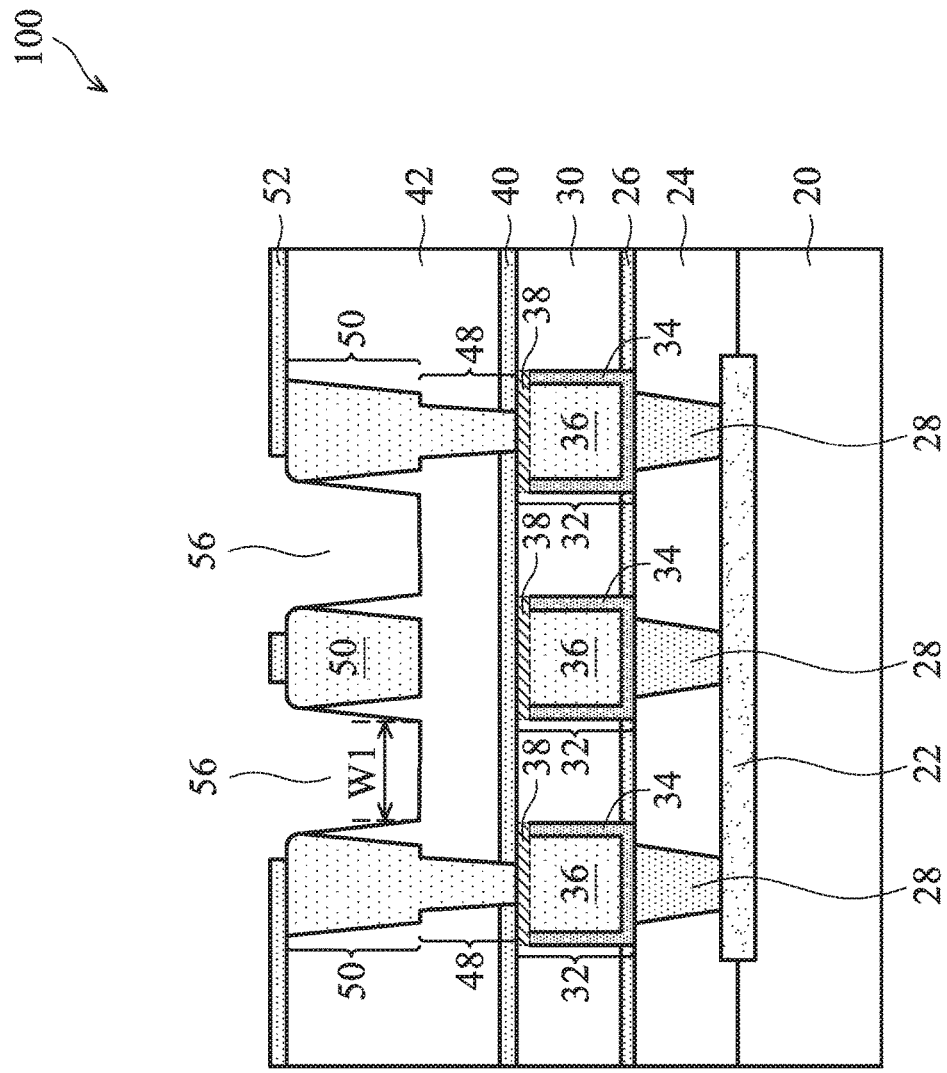

Referring to FIG. 5, photo resist 54 is applied over etch stop layer 52, and is patterned in a lithography process. The openings in photo resist 54 are vertically aligned to the portions of IMD layer 42 between neighboring conductive lines 50. Next, etch stop layer 52 and IMD layer 42 are etched using the patterned photo resist 54 as an etching mask, and hence trenches 56 are formed, as shown in FIG. 6. The respective step is shown as step 206 in the process flow shown in FIG. 11. In accordance with some embodiments of the present disclosure, instead of using photo resist 54, a tri-layer including a bottom layer, a middle layer and an upper layer (not shown) is used for the etching of IMD layer 42. The etching may be performed using a time mode, and the etching is stopped when the bottoms of trenches 56 are substantially level with the bottom surfaces of conductive lines 50. The etching may be performed using dry etching, wherein a fluorine-containing gas may be used as the etching gas. The remaining photo resist 54 is then removed.

Since the sidewalls of conductive lines 50 may be slanted, there may exist some residue portions of IMD layer 42 on the sidewalls of conductive lines 50, as illustrated in FIG. 6. In accordance with alternative embodiments, the illustrated residue portions of IMD layer 42 do not exist, and the sidewalls of conductive lines 50 are exposed to trenches 56.

In the etching of IMD layer 42, the corners of conductive lines 50 may be rounded due to the etching, as illustrated in FIG. 6. In accordance with some embodiments of the present disclosure, width W1 of trenches 56 are in the range between about 30 nm and about 50 nm. It is appreciated that the values recited throughout the description are examples, and may be changed to different values.

Figure 7:
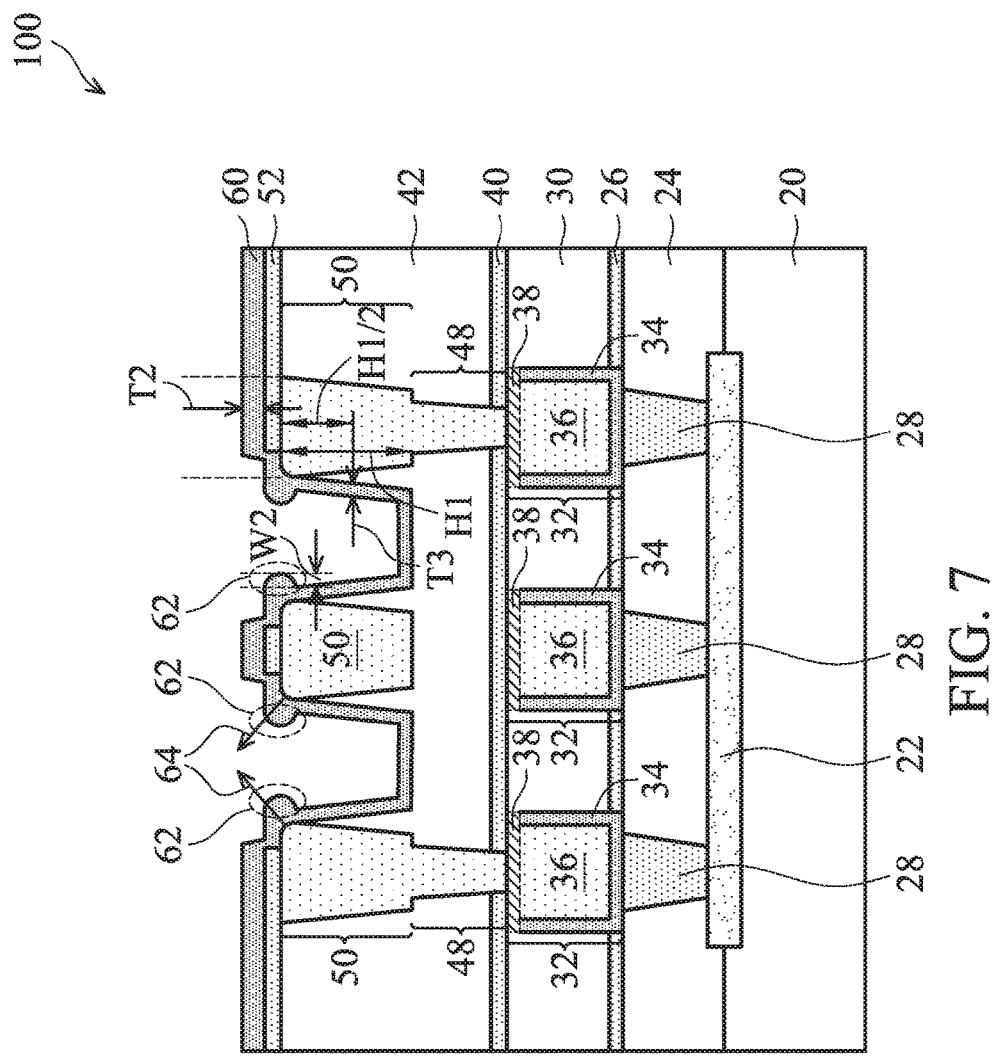

FIG. 7 illustrates the formation of etch stop layer 60. The respective step is shown as step 208 in the process flow shown in FIG. 11. In accordance with some embodiments of the present disclosure, etch stop layer 60 is formed of a dielectric material, which may include a first element(s) such as Si and/or Al, and second elements selected from carbon, nitride, oxygen, hydrogen, boron, or the like. In accordance with some exemplar embodiments, etch stop layer 60 is formed of silicon carbide, silicon nitride, silicon oxynitride, silicon carbo-nitride, silicon boron-nitride, or the like. Etch stop layer 60 has a first portion overlapping etch stop layer 52, second portions in contact with the exposed portions of conductive lines 50, and third portions at the bottoms and sidewalls of trenches 56.

Etch stop layer 60 is a non-conformal layer. For example, when measured at a position aligned to a middle line between the opposite sidewalls of one of conductive lines 50, the thickness of etch stop layer 60 is T2, which is the thickness of the horizontal portion of etch stop layer 60 directly over etch stop layer 52. When measured at a level aligned to the mid-height, which is a half of the height H1, of one of conductive lines 50, the thickness of etch stop layer 60 is T3, which is the thickness of the sidewall portion of etch stop layer 60 in trench 56. In accordance with some exemplary embodiments, the non-conformal layer 60 has thickness ratio T3/T2 smaller than 60 percent. Thickness ratio T3/T2 may also be smaller than about 40 percent.

In accordance with some exemplary embodiments, etch stop layer 60 is formed using a non-conformal deposition method. For example, etch stop layer 60 may be formed using PECVD, wherein the plasma is continuously turned on during the deposition of etch stop layer 60. Alternatively stated, during the deposition of etch stop layer 60, the plasma does not have on/off cycles, and hence the resulting etch stop layer 60 is non-conformal.

As also shown in FIG. 7, due to the non-conformal deposition, etch stop layer 60 has overhangs 62, which are the portions protruding horizontally beyond the underlying portions. The illustrated overhangs 62 may be exaggerated. With the proceeding of the deposition of etch stop layer 60, overhangs 62 grow in the directions of arrows 64. In accordance with some embodiments of the present disclosure, the width W2 of overhangs 62 is greater than about 50 Å.

Figure 8:
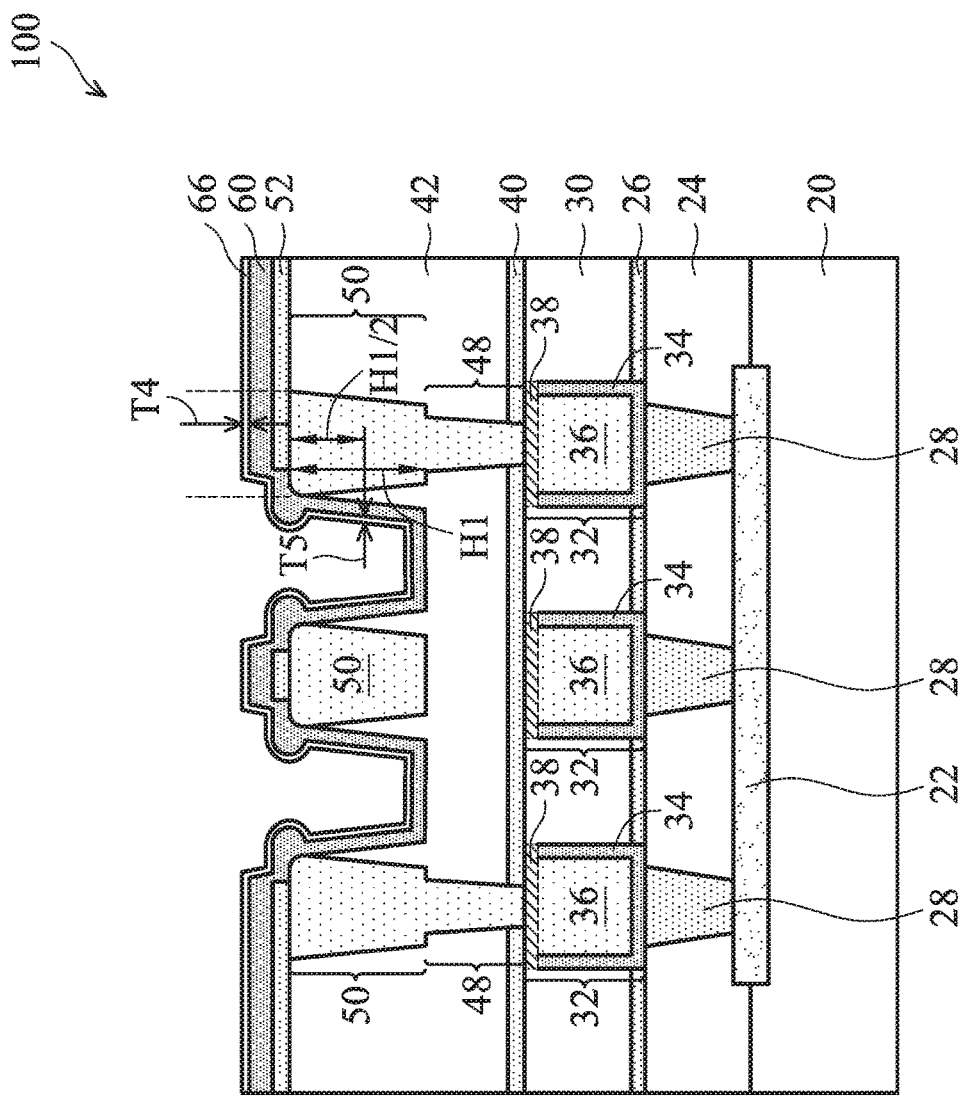

FIG. 8 illustrates the formation of etch stop layer 66. The respective step is shown as step 210 in the process flow shown in FIG. 11. In accordance with some embodiments of the present disclosure, etch stop layer 66 is formed of a dielectric material, which may also include a first element(s) such as Si and/or Al, and second elements selected from carbon, nitride, oxygen, hydrogen, boron, or the like. In accordance with some exemplar embodiments, etch stop layer 66 is also formed of silicon carbide, silicon nitride, silicon oxynitride, silicon carbo-nitride, silicon boron-nitride, or the like. Etch stop layer 66 has a first portion overlapping etch stop layer 60, and second portions extending into trenches 56 to cover the bottoms and sidewalls of trenches 56.

Etch stop layer 66 is more conformal than etch stop layer 60. Furthermore, etch stop layer 66 is a conformal layer in accordance with some embodiments. For example, when measured at a position aligned to a middle line between the opposite sidewalls of one of conductive lines 50, the thickness of etch stop layer 66 is T4, which is the thickness of the horizontal portion of etch stop layer 66 directly over etch stop layer 60. When measured at a level aligned to the mid-height, which is a half of the height H1 of, one of conductive lines 50, the thickness of etch stop layer 66 is T5, which is the thickness of the sidewall portion of etch stop layer 66 in trench 56. In accordance with some exemplary embodiments, the conformal layer 66 has thickness ratio T5/T4 greater than 60 percent. Thickness ratio T5/T4 may also be greater than about 70 percent or 80 percent. The difference (T5/T4−T3/T2) may be greater than about 0.2 in accordance with some embodiments.

In accordance with some exemplary embodiments, etch stop layer 66 is formed using a conformal deposition method. For example, etch stop layer 66 may be formed using PECVD, wherein the plasma is repeatedly turned on and off during the deposition of etch stop layer 66. Throughout the description, the term "period" is used to refer to the time it takes for the plasma to complete an on-and-off cycle. Turning plasma on and off once is referred to as one duty cycle, and the deposition of etch stop layer 66 may include many duty cycles. Different from Atomic Layer Deposition (ALD), during the off stages of the PECVD, the precursors for forming etch stop layer 66 are not purged. In accordance with some embodiments of the present disclosure, a duty cycle may include on/period ratio in the range between about 10 percent and about 50 percent, which is the ratio of the duration of the on time to the duration of the period. For example, an on/period ratio of 10% at a frequency of 500 Hz may mean turning off plasma for about 18 ms, and then turning on plasma for about 2 ms in accordance with some exemplary embodiments.

In accordance with some exemplary embodiments, etch stop layers 60 and 66 are in-situ formed, and the formation of etch stop layer 60 may be transitioned continuously to the formation of etch stop layer 66, with no vacuum break therebetween. Furthermore, the same precursors may be used for forming both etch stop layers 60 and 66, and the flow rates of the precursors may be kept the same, except the continuously turned-on plasma for forming non-conformal etch stop layer 66 may be transitioned to off/on cycles to form conformal etch stop layer 66. In accordance with alternative embodiments, etch stop layer 66 is formed using ALD.

In accordance with some embodiments of the present disclosure, the formation of non-conformal etch stop layer 60 may also be turned on and off repeatedly. The on/period ratio for forming non-conformal etch stop layer 60, however, is higher than the on/period ratio for forming conformal etch stop layer 66. Accordingly, by adjusting the off/on ratio of etch stop layers 60 and 66, the conformity of etch stop layers 60 and 66 may be adjusted to generate desirable result.

Throughout the description, when two layers are referred to as having the same composition, it means that the two layers have same types of elements, and the percentages of the elements in two layers are the same as each other. Conversely, when two layers are referred to as having different compositions, it means that one of the two layers either has at least one element not in the other layer, or the two layers have the same elements, but the percentages of the elements in two layers are different from each other. In accordance with some embodiments of the present disclosure, two or all three of etch stop layers 52, 60 and 66 have the same composition or different compositions in any combination. Regardless of whether etch stop layers 52, 60 and 66 have the same composition or different compositions, etch stop layers 52, 60 and 66 may be distinguishable from each other since they are formed in different process steps. For example, when analyzed using Transmission electron microscopy (TEM) or Energy-dispersive X-ray spectroscopy (EDX) or X-ray Photoelectron Spectroscopy (XPS), the interfaces of layers 52, 60 and 66 may be distinguishable.

Figure 9:
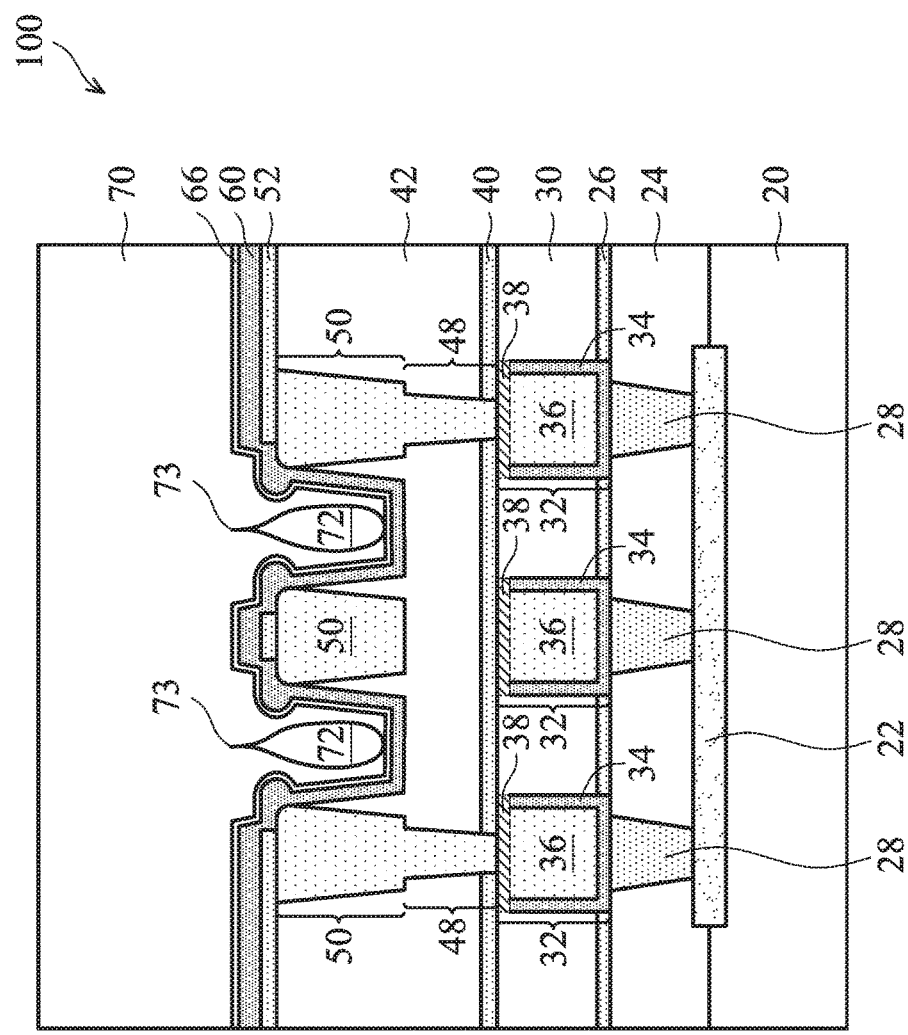

Next, as shown in FIG. 9, dielectric material/layer 70 and air gaps 72 are formed. The respective step is shown as step 212 in the process flow shown in FIG. 11. Dielectric material 70 may be a low-k dielectric material, which may be selected from the same group of candidate materials of IMD layer 42. Dielectric material 70 and IMD layer 42 may also be formed of different dielectric materials. In accordance with some embodiments of the present disclosure, dielectric layer 70 is deposited using a non-conformal deposition method such as PECVD. During the deposition, plasma may be kept on without off/on duty cycles, or with off/on duty cycles having a low off/on ratio. Air gaps 72 are formed between conductive lines 50. The dielectric constant (k value) of air gaps 72 is equal to 1.0, and hence the formation of air gaps 72 helps reduce the parasitic capacitance between conductive lines 50. Top tips 73 of air gaps 72 may be lower than a top surface of a horizontal portion of etch stop layer 66, and higher than the top surfaces of conductive lines 50.

Non-conformal etch stop layer 60 and conformal layer 66 in combination have the advantageous features of generating air gaps 72, and also keeping the top tips 73 of air gaps as low as possible. For example, non-conformal etch stop layer 60 results in overhangs 62 (FIG. 7), which causes or at least helps the formation of air gaps 72. However, overhangs 62 tend to grow in the directions of arrows 64 (FIG. 7). If conformal etch stop layer 66 is not formed, the low-k dielectric layer 70 (which is also formed using a non-conformal deposition method) tend to continue the growth of overhangs 62 in the directions of arrows 64 (FIG. 7). This means the resulting top tips of air gaps 72 will be at a very high position. Conformal etch stop layer 66, on the other hand, grows more uniformly in all directions including horizontal directions, and hence the resulting growth in the horizontal directions is faster, resulting in the earlier closing of air gaps 72. Accordingly, the positions of top tips 73 of air gaps 72 are advantageously lowered.

Figure 10:
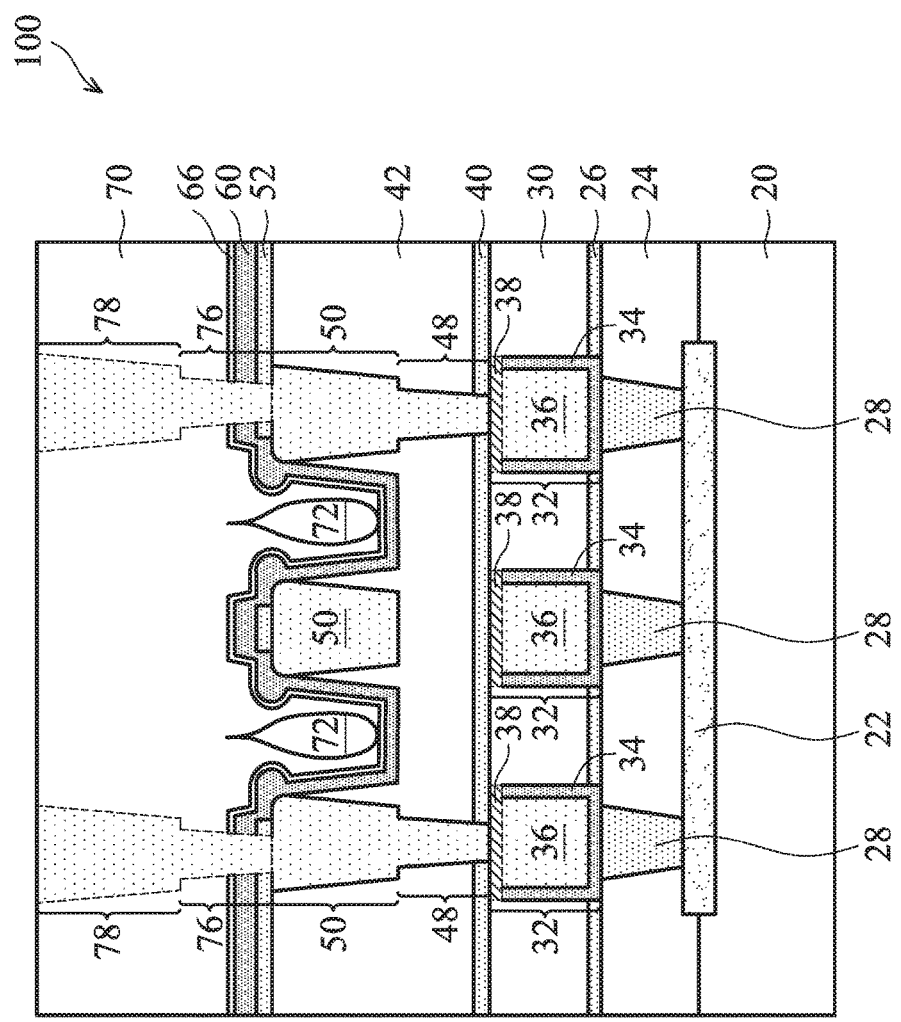
Figure 11:
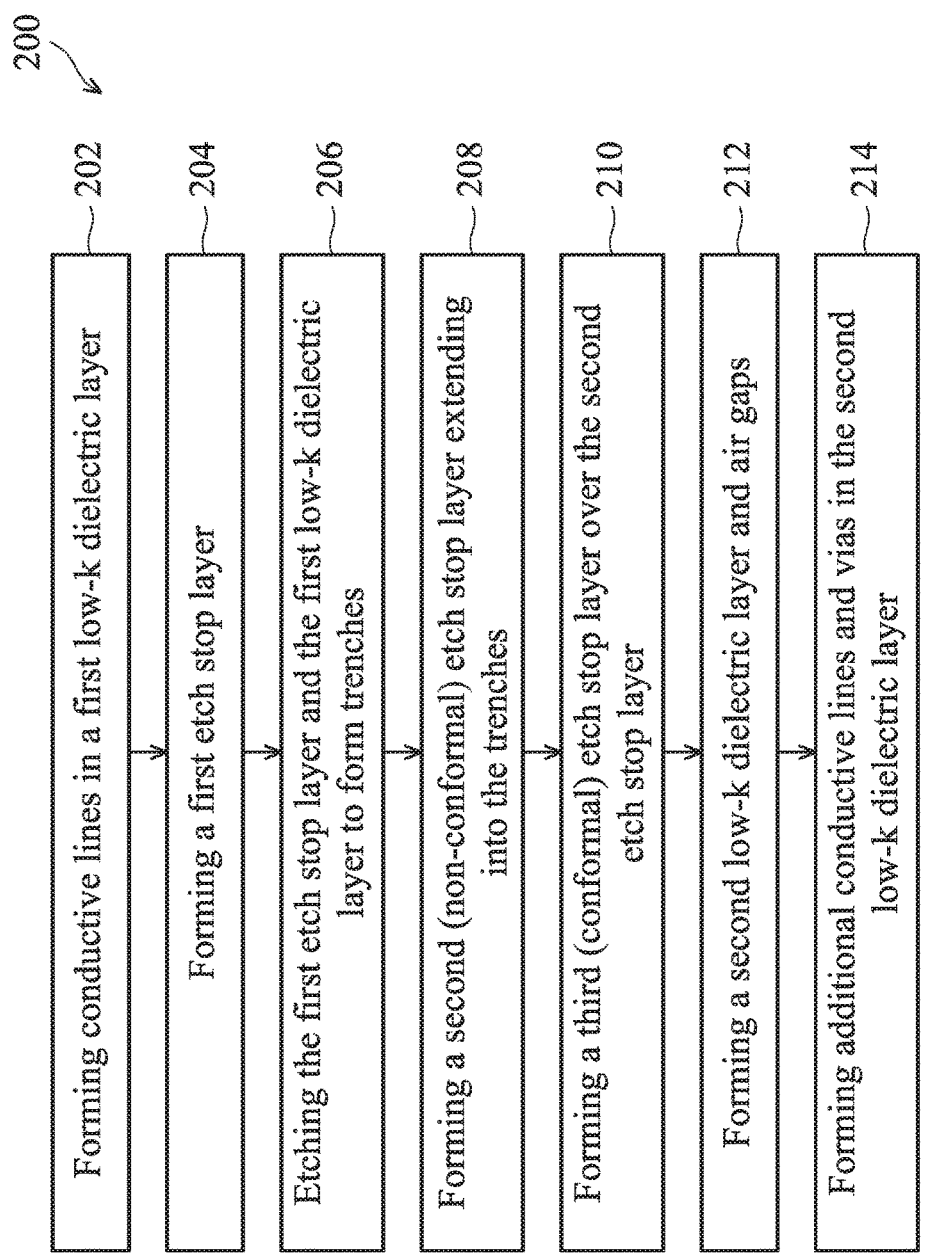
FIG. 11 illustrates a process flow for forming an interconnect structure having air gaps in accordance with some embodiments.

FIG. 10 illustrates the formation of conductive lines 78 and vias 76 in low-k dielectric layer 70. The respective step is shown as step 214 in the process flow shown in FIG. 11. The formation of metal lines 78 and vias 76 may be essentially the same as the formation of conductive lines 50 and vias 48, respectively. It is appreciated that conductive lines 78 and vias 76 are illustrated using dashed lines to indicate that they are connected to conductive lines 50, but they are not in the region wherein air gaps 72 are formed. Rather, they may be connected to the portions of conductive lines 50 that are not adjacent to air gaps. Accordingly, conductive lines 78 and vias 76 are not in the plane as illustrated, and are illustrated using dashed lines. In subsequent steps, the steps shown in FIGS. 4 through 9 are repeated to form air gaps between neighboring conductive lines 78. The details of the processes and the materials are not repeated herein.

It is appreciated that the process steps shown in FIGS. 4 through 9 may also be used to form air gaps between conductive lines 32. In the corresponding process, after the structure shown in FIG. 1 is formed, the steps shown in FIGS. 2 and 3 are skipped, and the steps shown in FIGS. 4 through 9 are performed. The trenches (corresponding to trenches 56 in FIG. 6) formed by etching low-k dielectric layer 30 may be stopped on the top surface of etch stop layer 30. The rest of the processes and structures may be realized through the teaching of the embodiments shown in FIGS. 4 through 9.

The embodiments of the present disclosure have some advantageous features. By forming both non-conformal etch stop layer and conformal etch stop layer, air gaps are formed, and the top tips of the air gaps are kept low. Simulation results indicate that the top tips that are high suffer from high stress, and the top tips become the weak points of the resulting structure. Accordingly, by lowering the top tips of air gaps, the reliability of the resulting structure is improved.

In accordance with some embodiments of the present disclosure, a method includes forming a first conductive line and a second conductive line in a dielectric layer, etching a portion of the dielectric layer to form a trench between the first conductive line and the second conductive line, and forming a first etch stop layer. The first etch stop layer extends into the trench. A second etch stop layer is formed over the first etch stop layer. The second etch stop layer extends into the trench, and the second etch stop layer is more conformal than the first etch stop layer. A dielectric material is filled into the trench and over the second etch stop layer. An air gap is formed in the dielectric material.

In accordance with some embodiments of the present disclosure, a method includes forming a first etch stop layer over a first conductive line, a second conductive line, and a dielectric layer, etching the first etch stop layer and a portion of the dielectric layer to form a trench between the first conductive line and the second conductive line, and forming a second etch stop layer including a first portion overlapping a remaining portion of the first etch stop layer, and a second portion extending into the trench. The second etch stop layer has an overhang protruding directly over a portion of the trench, with the overhang being directly over a portion of the trench. A third etch stop layer is formed over the second etch stop layer and extending into the trench, wherein the third etch stop layer is a conformal layer. A low-k dielectric material is filled into the trench to form an air gap, with a portion of the air gap in the trench.

In accordance with some embodiments of the present disclosure, an integrated circuit structure includes a dielectric layer, a first conductive line and a second conductive line in the dielectric layer, and a trench between the first conductive line and the second conductive line. The integrated circuit structure further includes a first etch stop layer having a first portion overlapping the first conductive line, and a second portion extending into the trench. A second etch stop layer is over the first etch stop layer and includes a third portion overlapping the first portion of the first etch stop layer, and a fourth portion extending into the trench. The second etch stop layer is more conformal than the first etch stop layer. A dielectric material extends into the trench and overlies the second etch stop layer. An air gap is in the dielectric material and in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first conductive line and a second conductive line in a dielectric layer;
   etching a portion of the dielectric layer to form a trench between the first conductive line and the second conductive line;
   forming a first etch stop layer, wherein the first etch stop layer extends into the trench, and the first etch stop layer is formed using a first deposition method;
   forming a second etch stop layer over the first etch stop layer, wherein the second etch stop layer extends into the trench, and the second etch stop layer is more conformal film than the first etch stop layer; and
   filling a dielectric material into the trench.

2. The method of claim 1, wherein the forming the second etch stop layer comprises a first plurality of off/on cycles, wherein a plasma is turned on and off during each of the first plurality of off/on cycles.

3. The method of claim 2, wherein during the forming the first etch stop layer, plasma is turned on continuously without off/on cycles.

4. The method of claim 2, wherein the forming the first etch stop layer comprises a second plurality of off/on cycles, and an off-to-on ratio of the second plurality of off/on cycles is smaller than an off-to-on ratio of the first plurality of off/on cycles.

5. The method of claim 1, wherein the forming the first etch stop layer and the forming the second etch stop layer are performed using same process gases with same flow rates, with no vacuum break therebetween.

6. The method of claim 1, wherein both the first etch stop layer and the second etch stop layer are formed using Plasma Enhanced Chemical Vapor Deposition (PECVD).

7. The method of claim 1 further comprising:
   forming a third etch stop layer underlying a horizontal portion of the first etch stop layer, wherein the third etch stop layer overlaps the first and the second conductive lines, and the third etch stop layer is formed as a blanket layer over the first and the second conductive lines; and
   etching the blanket layer along with the dielectric layer is etched to form the trench.

8. The method of claim 1, wherein an air gap is formed in the dielectric material.

9. A method comprising:
   forming a first etch stop layer over a first conductive line, a second conductive line, and a dielectric layer;
   etching the first etch stop layer and a portion of the dielectric layer to form a trench between the first conductive line and the second conductive line;
   forming a second etch stop layer comprising a first portion overlapping a remaining portion of the first etch stop layer, and a second portion extending into the trench, wherein during the forming the second etch stop layer, plasma is continuously turned on;
   forming a third etch stop layer over the second etch stop layer and extending into the trench, wherein during the forming the third etch stop layer, plasma is turned on and off to have a plurality of on-and-off cycles; and
   filling a low-k dielectric material into the trench to form an air gap, with a portion of the air gap in the trench.

10. The method of claim 9, wherein the plurality of on-and-off cycles have an on/period ratio in a range between about 10 percent and about 50 percent, wherein the on/period ratio is a ratio of an on-time of an on-and-off cycle to a total time of the on-and-off cycle.

11. The method of claim 9, wherein same precursors are used in the forming the second etch stop layer and the forming the third etch stop layer.

12. The method of claim 11, wherein flow rates of the same precursors are the same in the forming the second etch stop layer as in the forming the third etch stop layer.

13. The method of claim 9, wherein a top tip of the air gap is lower than a top surface of a horizontal portion of the third etch stop layer.

14. The method of claim 9, wherein the forming the second etch stop layer and the forming the third etch stop layer are performed using Plasma Enhanced Chemical Vapor Deposition (PECVD).

15. A method comprising:
   forming a first etch stop layer over a first conductive line, a second conductive line, and a dielectric layer;
   etching the first etch stop layer and a portion of the dielectric layer to form a trench between the first conductive line and the second conductive line;

forming a second etch stop layer extending into the trench, wherein the forming the second etch stop layer lasts for a first period of time, and during the first period of time, plasma is turned on for a first total on-time; and forming a third etch stop layer over the second etch stop layer and extending into the trench, wherein the forming the third etch stop layer lasts for a second period of time, and wherein during the second period of time, plasma is turned on for a second total on-time, and a first ratio of the first total on-time to the first period of time is greater than a second ratio of the second total on-time to the second period of time.

16. The method of claim 15 further comprising:

depositing an isolation material over the third etch stop layer, wherein a portion of the isolation material is filled into the trench.

17. The method of claim 16, wherein the isolation material has an air gap therein, and a top tip of the air gap is lower than a top surface of a horizontal portion of the third etch stop layer.

18. The method of claim 15, wherein the second etch stop layer comprises an overhang.

19. The method of claim 15, wherein the first ratio is equal to 1, and the second ratio is smaller than 1.

20. The method of claim 15, wherein both the first ratio and the second ratio are smaller than 1.

* * * * *